US011337325B2

(12) United States Patent
Ni et al.

(10) Patent No.: US 11,337,325 B2
(45) Date of Patent: May 17, 2022

(54) MOVABLE PCIE MODULE AND SERVER CHASSIS SYSTEM

(71) Applicant: Quanta Computer Inc., Taoyuan (TW)

(72) Inventors: Hsiao-Tsu Ni, Taoyuan (TW); Wei-Pin Chen, Taoyuan (TW); Hou-Ming Tseng, Taoyuan (TW); Wei-Han Ho, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/137,984

(22) Filed: Dec. 30, 2020

(65) Prior Publication Data

US 2022/0061176 A1  Feb. 24, 2022

Related U.S. Application Data

(60) Provisional application No. 63/068,791, filed on Aug. 21, 2020.

(51) Int. Cl.
*H05K 5/02* (2006.01)
*H05K 7/20* (2006.01)
*H05K 7/14* (2006.01)

(52) U.S. Cl.
CPC ......... *H05K 5/0265* (2013.01); *H05K 7/1488* (2013.01); *H05K 7/20736* (2013.01)

(58) Field of Classification Search
CPC ....................................................... H05K 7/00
See application file for complete search history.

(56) References Cited

U.S. PATENT DOCUMENTS 10,905,024 B1\* 1/2021 Fu ........................ H05K 5/0213
2021/0117364 A1\* 4/2021 Yun ........................ H01R 12/73

\* cited by examiner

*Primary Examiner* — Jerry Wu
(74) *Attorney, Agent, or Firm* — Nixon Peabody LLP

(57) ABSTRACT

Described herein is a server that includes a server chassis having a front window for providing access to an interior receptacle of the server chassis. A docking station is located in the interior receptacle. The server also includes a PCIe module coupled to the docking station by a coupling element. The PCIe module protrudes externally from the interior receptacle through the front window in the docked position. The PCIe module can be moved to a plurality of undocked positions while remaining coupled to the docking station.

12 Claims, 9 Drawing Sheets

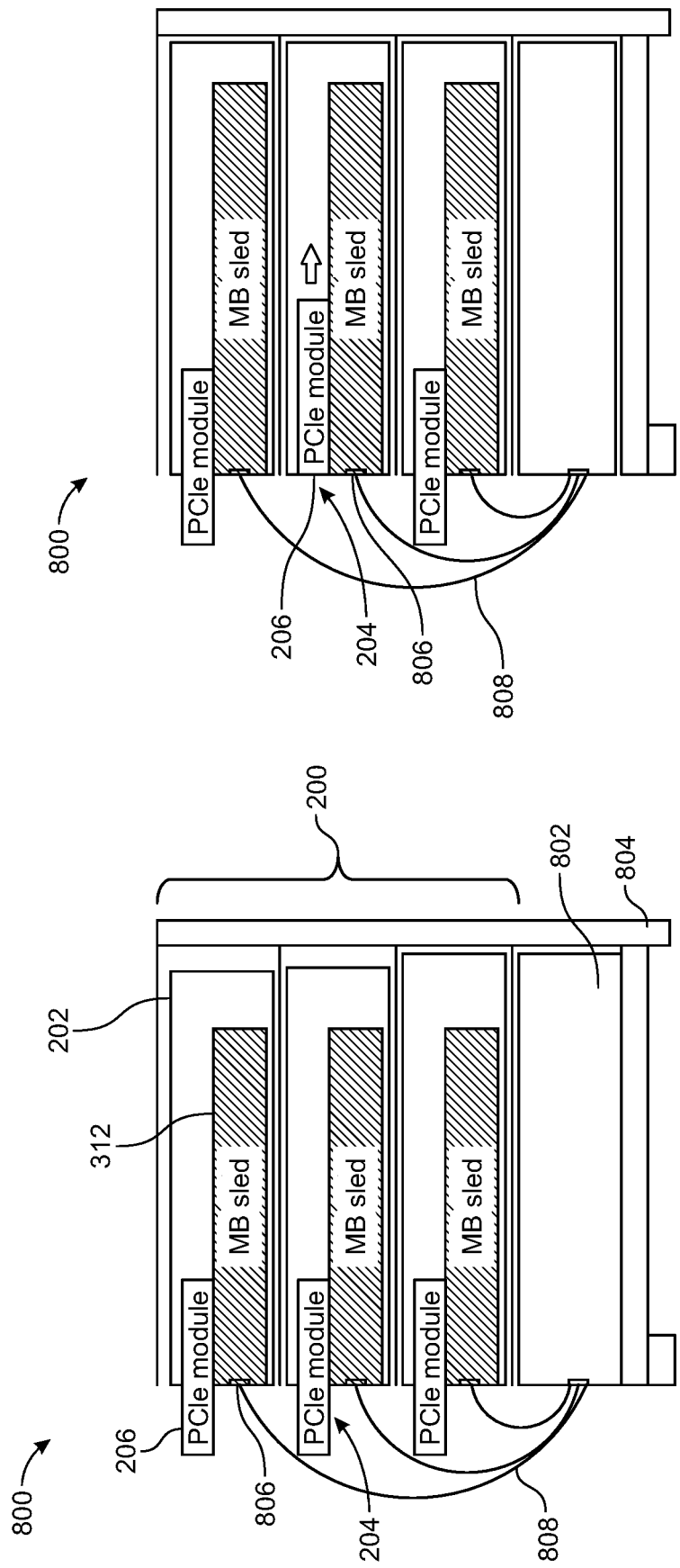

MOVABLE PCIE MODULE AND SERVER CHASSIS SYSTEM

PRIORITY CLAIM

This application claims priority under 35 U.S.C. § 119 to U.S. Provisional Application No. 63/068,791, entitled "APPLICATION OF REMOVABLE PCIE MODULE ON MOTHER BOARD MODULE," and filed on Aug. 21, 2020. The contents of that application are hereby incorporated by reference in their entirety.

TECHNICAL FIELD

The present disclosure relates generally to a server having a Peripheral Computer Interconnect Express (PCIe) module movably coupled to a server chassis. The PCIe module is movable to a plurality of positions, while remaining coupled to the chassis, and is moveable to a docked position where the PCIe module protrudes externally from the chassis.

BACKGROUND

Servers are specialized computer systems that include numerous electrical components integrated into a single unit using a server chassis. Common to all servers is some form of a motherboard including a central processing unit (CPU), memory device slots (e.g., DDR3, DDR4, DRAM), PCIe slots, and connectors to other components, such as hard drives, a power supply, and peripherals (e.g., universal serial bus (USB) ports, local area network (LAN), and other input-output (I/O) ports). The trend, consistent with "Moore's Law," is for smaller and denser devices to be used in servers. This allows for more devices to be included in servers, with a concomitant increase in computation power and memory, but without increasing the footprint of the server.

As a consequence of the increase in the number of devices in servers, the power density increases. Heat in the servers also increases, requiring ever more aggressive cooling. An exacerbating factor is that the increased number of devices in the server restricts the flow of cooling air to the devices.

Accordingly, to maintain optimal temperatures, fans, air ducts, heat sinks, and the like are incorporated in chassis designs. For example, FIG. 1 illustrates a prior art server 100 having a chassis 102. The chassis 102 has a front window 104, shown outlined by a dashed line, and a PCIe module 106 positioned in the front window 104. Module vent holes 108 and chassis vent holes 110 are also shown. The vent holes 108, 110 allow for air to enter into the interior of the chassis and thereby cool components in the chassis. However, the PCIe module 106 only presents a small surface area for positioning of vent holes 108 that can introduce external air. Furthermore, some of the chassis vent holes 110, such as vent hole 110a, can be partially blocked by the portion of the PCIe module 106 in the chassis.

Thus, there is a need for new cooling solutions that are effective and can accommodate the ever increasing density and number of devices in a server. Solution to these and other problems are the subject of this disclosure.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

A first implementation of the disclosure is a server. The server includes a server chassis having a front window for providing access to an interior receptacle of the server chassis. The server chassis has a docking station within the interior receptacle. The server also includes a PCIe module coupled to the docking station by a coupling element. The PCIe module protrudes externally from the interior receptacle through the front window in a docked position. The PCIe module can be moved to a plurality of undocked positions while remaining coupled to the docking station. Optionally, the coupling element includes an elastic element configured to restore the PCIe module to the docked position from any one of the plurality of undocked positions. For example, the elastic element can be a spring.

In some implementations of the server, the PCIe module is movable from the docked position to one of the plurality of undocked positions. The PCIe module protrudes less externally from the front window in the undocked position than the PCIe module protrudes in the docked position. Optionally, a cooling air flowing through the server chassis has a higher flow rate into the interior receptacle when the PCIe module is in the docked position than when the PCIe module is in the undocked position. Optionally, the cooling air flow is between 1% and 50% higher than when the PCIe module is in the docked position.

Optionally, the PCIe module includes a riser board and a riser bracket. The riser board and the riser bracket are configured to hold one or more PCIe cards. Optionally, the riser board includes a front portion having a plurality of vent holes providing air flow to the interior receptacle. The front portion and the plurality of vent holes are positioned out of the interior receptacle in the docking position. At least a portion of the front portion and a portion of the vent holes are positioned in the interior receptacle when the module is in the undocked position.

Optionally, the coupling element includes a pin and a support member. A first end of the pin is mounted on a surface of the docking station. A second end of the pin is inserted into the slot, which is provided by a support member. The support member is mounted on a side wall of the riser bracket. A spring is positioned in the slot and configured to provide a restoring force against the pin and the support member. The restoring force provides an opposing force to an undocking force, moving the PCIe module from the docked position to the undocked position. When the PCIe module is in the undocked position, the restoring force can move the PCIe module from the undocked position to the docked position.

In yet other implementations, the server further includes a motherboard sled positioned in the interior receptacle. A front portion of the motherboard sled is a part of the docking station to which the PCIe module is coupled. Optionally, a movable internal cable is included in the interior receptacle. The cable connects the PCIe module to the motherboard. The cable has at least a range of movements commensurate with the docked position and the plurality of undocked positions. Optionally, an external electrical cable is connected to an electrical connector positioned proximate to the front window. The external electrical cable is configured to connect to a server switch, and the PCIe module can move relative to the electrical cable.

A second implementation of the disclosure is a server system. The server system has multiple servers in a rack and a server switch. Each of the servers includes a server chassis, having a front window for providing access to an interior receptacle of the server chassis. The server chassis has a docking station within the interior chassis. An electrical connector is located at a position proximate to the front window. The electrical connector is immovably coupled to the server chassis. The server also includes a PCIe module coupled to the docking station by a coupling element. The PCIe module protrudes externally from the interior receptacle through the front window in the docked position. The PCIe module can be moved to multiple undocked positions while remaining coupled to the docking station. The server system also includes multiple external electric cables. Each one of the external cables is connected to a different one of the electrical connectors of the servers. All of the external cables are connected to the server switch.

Each of the external cables is connected to the electrical connector of one of the servers and to the server switch.

Optionally, each one of the servers is arranged in a stack in the server rack, where the front windows are co-planar. Optionally, each of the PCIe modules can move independently. Additionally, each of the PCIe modules can move relative to its corresponding electrical connector.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 8A shows a schematic side view of a server system, according to some implementations; and FIG. 8B shows a second view of the server system shown in FIG. 8B.

Figure 1:
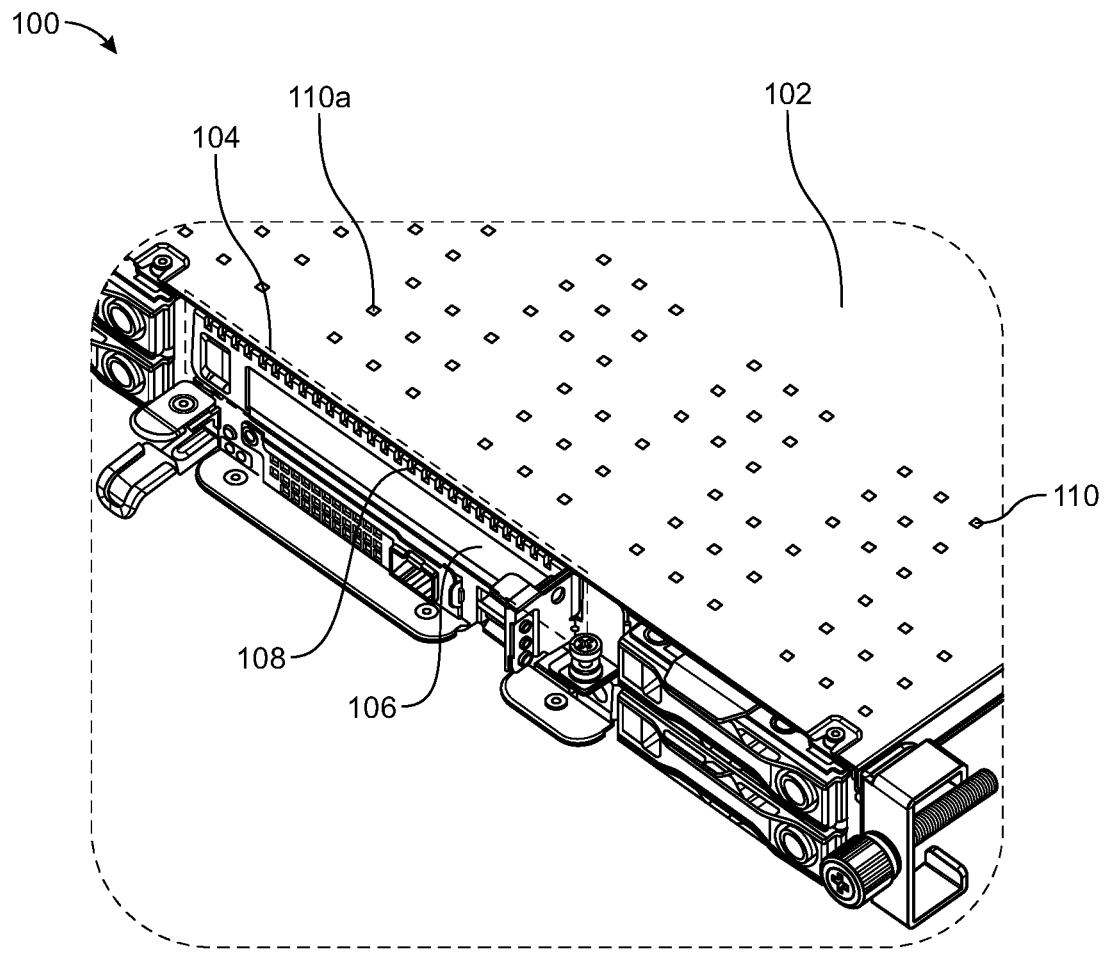
FIG. 1 shows a prior art server.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed to a server and solutions for cooling the server. The server includes a PCIe module that protrudes out of the server. This allows an increase in air entering the server and also provides space in the server for the air to flow and cool various components therein. However, the module protruding out of the server makes it difficult at times to access the front of the server chassis. This is especially true where the servers are stacked in a server rack. Therefore, the PCIe module is moveable to aid in providing access to the front of the chassis.

Figure 2:
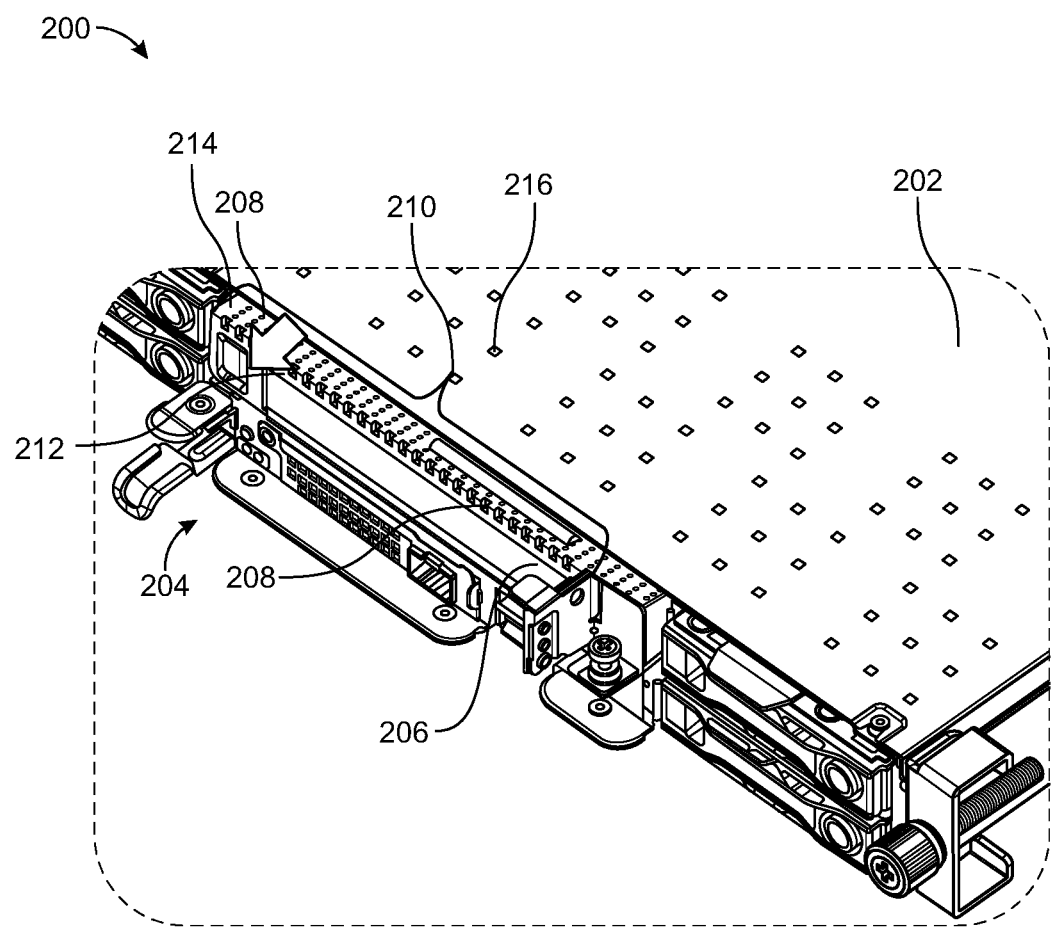
FIG. 2 is a perspective view of a server, according to some implementations.

FIG. 2 is a perspective view of a server 200, according to some implementations. The server includes a chassis 202 having a front window 204, similar to the front window 104 of the prior art server 100 (FIG. 1). A PCIe module 206 is shown in a docked position in the front window 204. In contrast to the prior art server 100, the PCIe module 206 protrudes out of server 200 in the shown docked position. Vent holes 208 are positioned on a front portion 210 of the PCIe module 206. The vent holes 208 on both a front plate 212 and a top plate 214 of the PCIe module 206 provide ambient air to the interior of the server chassis 202.

Figure 3:
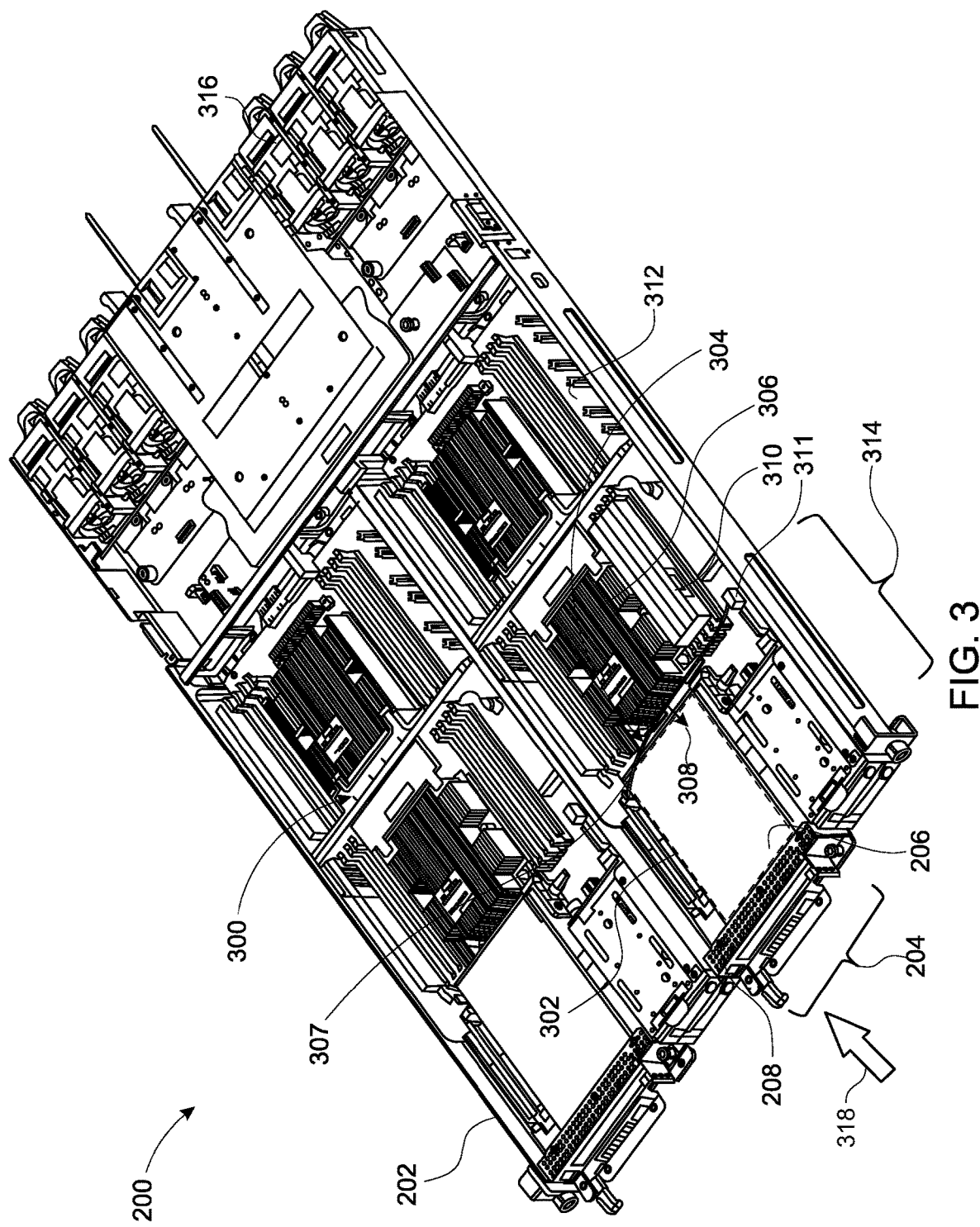
FIG. 3 is another perspective view of the sever shown in FIG. 2.

FIG. 3 is another perspective view of the server 200. In this view, a top panel of the chassis 202 is removed, revealing an interior receptacle 300. The interior receptacle 300 provides a space to contain the various components of server 200. For example, a motherboard sled 312 and associated components, such as a heat sink 306, a dynamic random-access memory (DRAM) 310, and an electrical connector 311, can be contained in the receptacle 300. The PCIe module 206 is shown placed in a docking station 302 (indicated by a dashed line) within the internal receptacle 300. In this implementation, the docking station 302 is accommodated as part of a front portion 314 of the motherboard sled 312. The PCIe module 206 protrudes externally from the interior receptacle 300 in the shown docked position.

In some implementations, a cooling air flow 318 is provided to the chassis 202. For example, a set of fans 316 can be included as a component of the server 200 to draw cooling air flow 318 into the internal receptacle 300. Movement of the PCIe module 206, as indicated by arrow 308, defines the docked position and a space 304. Cooling air flow 318, drawn in by fan 316, enters the internal receptacle 300 through vent holes 208 or vent holes 216 (FIG. 2). The cooling air flow 318 can flow over, around the PCIe module 206 and into the space 304. This provides cooling to the PCIe module 206 as well as other components, such as the heat sinks 306 and DRAM 310.

The cooling air flow 318 has a higher flow rate when the PCIe module 206 is in the docked position than when the PCIe module is in an undocked position. In the undocked position, the PCIe module 206 protrudes less out of the window 204 than when it is in the docked position. Therefore, the number of vent holes 208 that are presented to the ambient external air is reduced in the undocked position. In some implementations, the cooling air flow is between 1% and 50% higher when the PCIe module 206 is in the docked position than when the PCIe module 206 is in the undocked position. The cooling air flow 318 can be measured, for example, using a wind tunnel and Standard Test Method AMCA 210.

A movable internal cable 307 is also shown connecting the PCIe module 206 to the motherboard sled 312 via the electrical connector 311. The movable internal cable 307 has a range of movements commensurate with the range of movements represented by the arrow 308 of the PCIe module 206.

Figure 4:
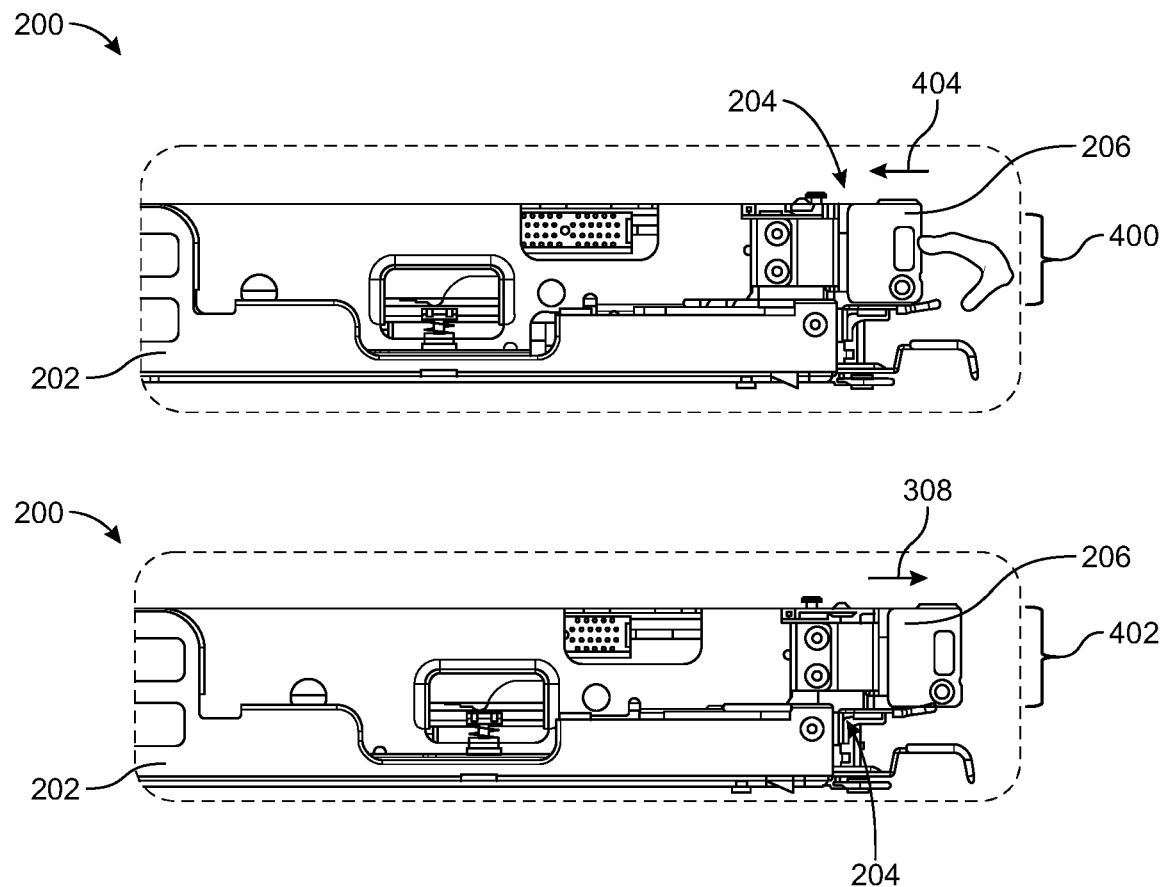
FIG. 4 shows two side views of the server shown in FIG. 2.

FIG. 4 illustrates two side views of the server 200. The top view shows an undocked position 400 of the PCIe module 206. In the bottom view, the PCIe module 206 is shown in the docked position 402. As indicated by the arrow 404, the PCIe module 206 can be pushed into the front window 204 to the undocked position 400. A reverse movement, indicated by arrow 308, moves the PCIe module 206 back to the docked position 402. Incremental movements between the docked position 402 and the undocked position 400 provide a plurality of possible undocked positions. In the undocked positions, the PCIe module 206 protrudes externally from the front window 204 less than the distance the PCIe module protrudes externally in the docked position 402.

Figure 5A:
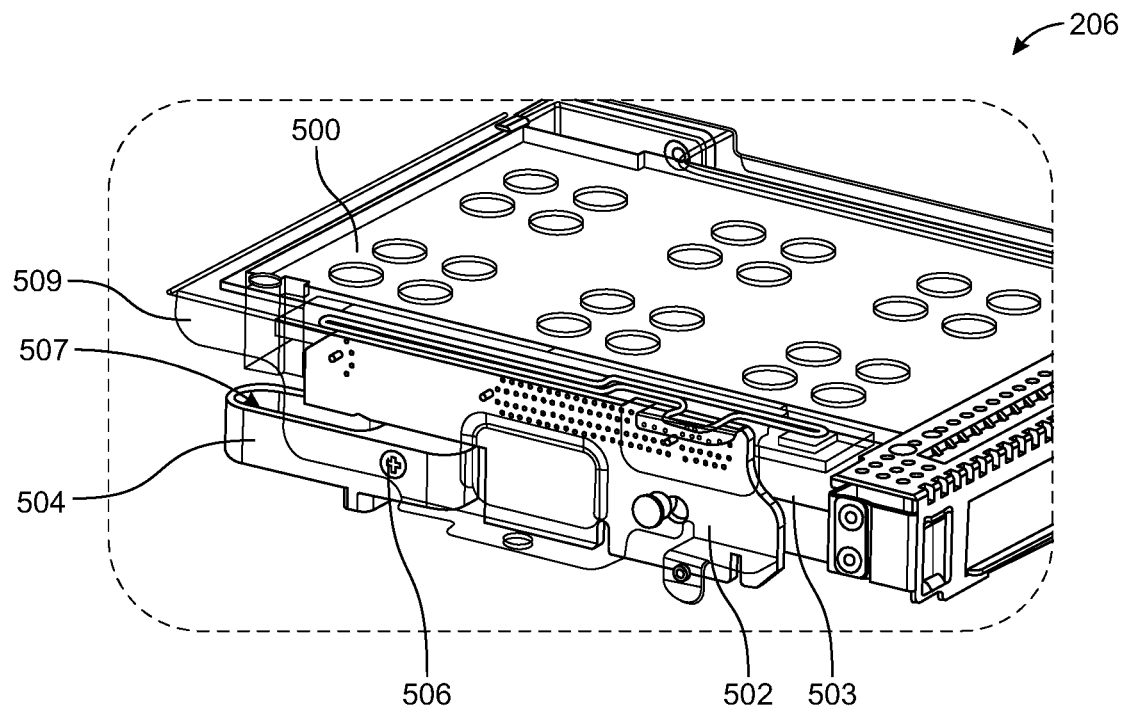
FIG. 5A shows a PCIe module, according to some implementations.
Figure 5B:
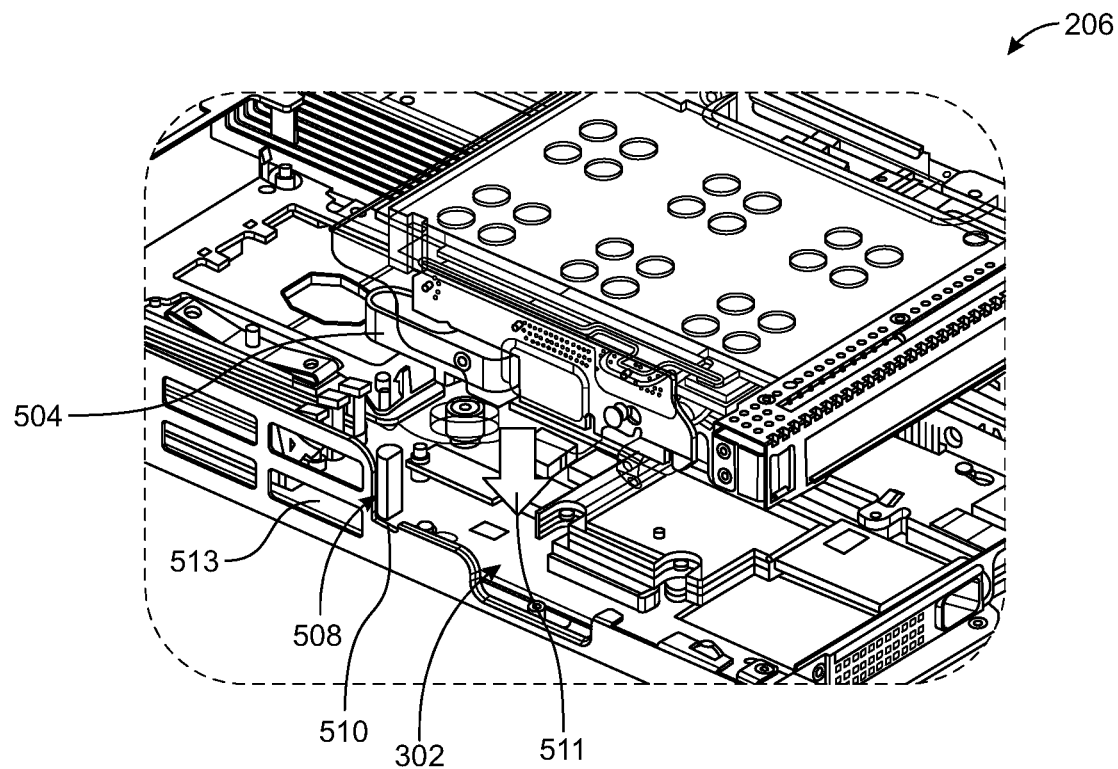
FIG. 5B shows the placement of the PCIe module shown in FIG. 5A into a docking station.
Figure 5C:
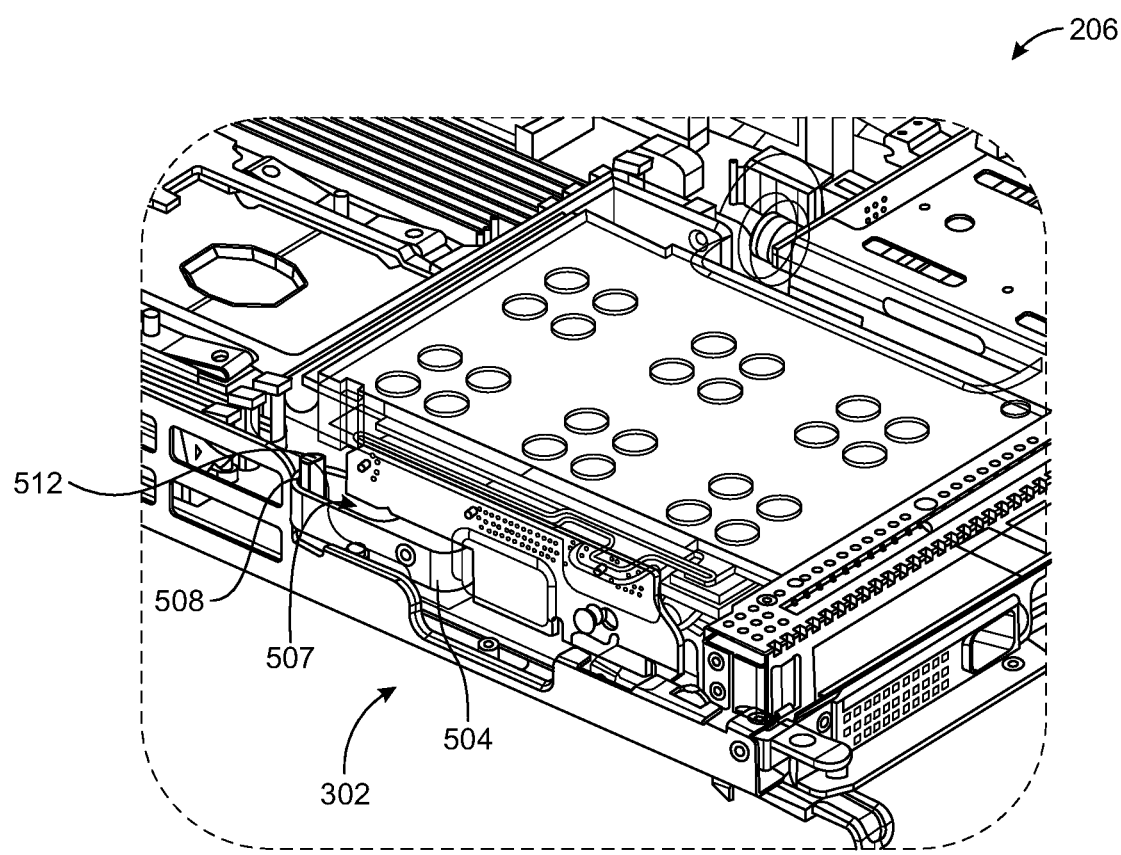
FIG. 5C shows the PCIe module in the docking station.

Although the PCIe module 206 can be positioned in a plurality of positions, the PCIe module 206 remains coupled to the server chassis 202. Accordingly, the PCIe module 206 remains an integrated and attached unit of the server 200 in all of the positions, including the docked position 402 and the undocked position 400. FIGS. 5A to 5C show an implementation of a coupling element for coupling the PCIe module 206 to the server chassis 202.

FIG. 5A shows the PCIe module 206, including a PCIe bracket 500 and a riser board 502. One or more PCIe cards 503 can be held in the PCIe module 206. The PCIe bracket 500 is shown in outline for clarity. A support member 504 is attached by a fastener 506 to a side wall 509 of PCIe bracket 500. A slot 507 of the support member 504 is also shown.

FIG. 5B shows the placement of the PCIe module 206 in the docking station 302. The docking station 302 includes a pin 508 which is mounted by a first end 510 on a surface 513 of the docking station 302. The pin 508 can be mounted by any method, such as by attachment with a fastener, adhered with a glue, welded, by a friction fit into a hole on the surface 513, or screwed into a hole on the surface 513. The slot 507 of support member 504 is aligned with the pin 508 for placement in direction 511.

FIG. 5C shows the PCIe module 206 in the docking station 302. A second end 512 of the pin 508 is inserted into the slot 507 of the support member 504.

Figure 6A:
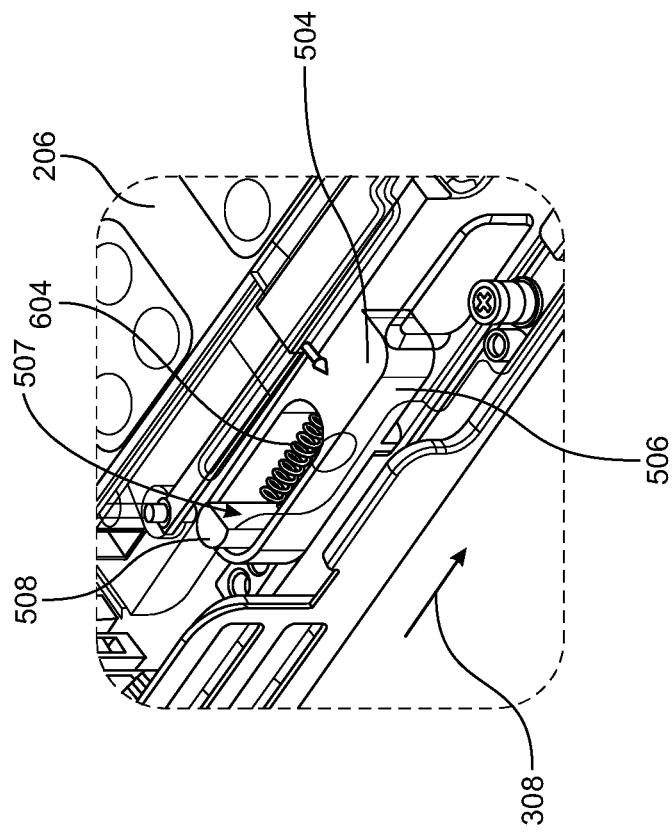
FIG. 6A shows a first view of a coupling element, according to some implementations.
Figure 6B:
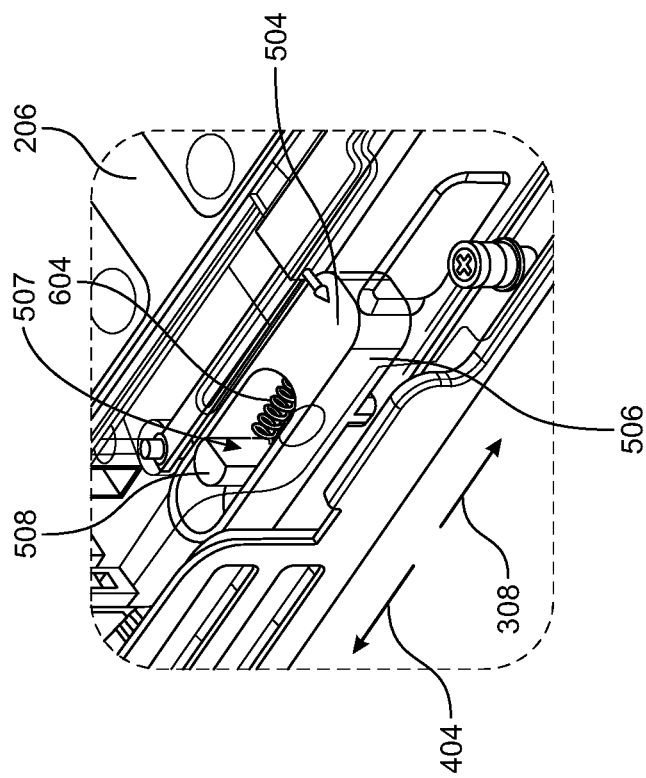
FIG. 6B shows a second view of the coupling element shown in FIG. 6A.

FIGS. 6A and 6B show two detailed views of the support member 504 shown in FIGS. 5A to 5C. The pin 508 moves relative to the support member 504 as indicated by arrows 308 and 404 in FIG. 6A. A spring 604 in the slot 507 is also shown pushing against the pin 508. The spring 604 provides a restoring force that moves the support member 504 in the direction of the arrow 308. The restoring force opposes an undocking force in the direction of arrow 404, which is opposite in direction to the restoring force. Therefore, the support member 504 moves to an undocked position shown in FIG. 6A due to an undocking force in direction 404. Once the undocking force in direction 404 is removed, the support member 504 moves in the direction of the arrow 308 to the position shown in FIG. 6B. Since the support member 504 is attached to the PCIe module 206 by the fastener 506, the PCIe riser module 206 moves with the support member 504.

Although a pin and slot coupling element is shown herein, other coupling elements can be used, according to some implementations. The coupling element can include any coupling element that allows for movement of the PCIe module 206 from a docked position to a plurality of undocked positions. In some implementations, the coupling elements can include, for example, a rail and groove, a pin and slot, a rack and pinion, a cylinder and piston, or a drawer slide.

Additionally, although a spring is shown here, any elastic element that can store and release mechanical energy can be used to provide a restoring force. For example, the elastic element can be an elastic band, a leaf spring, or a hydraulic piston.

Figure 7:
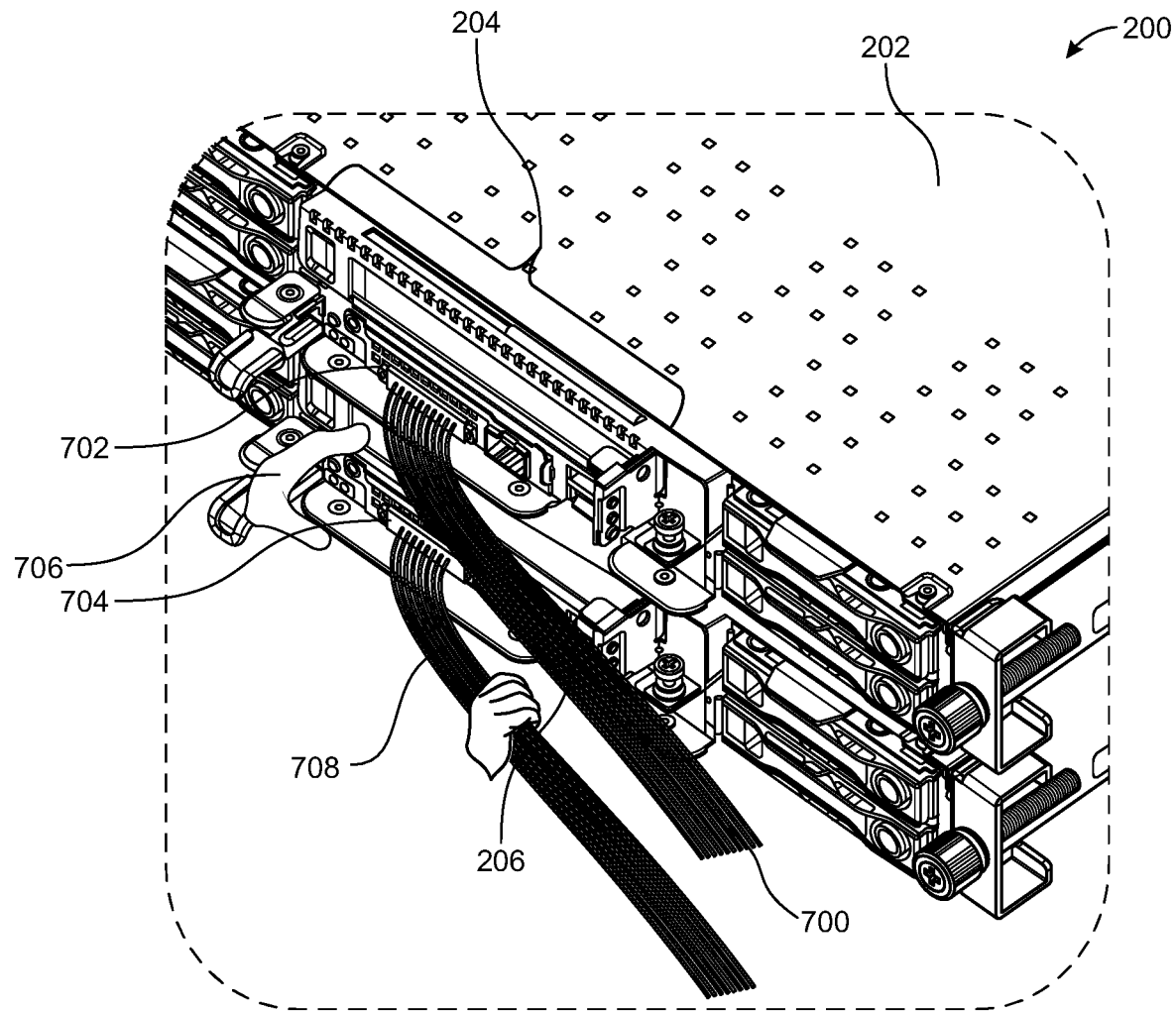
FIG. 7 shows two servers 200 stacked on top of each other, according to some implementations.

FIG. 7 shows two servers 200 stacked on top of each other. An external electrical cable 700 is shown connected to an electrical connector 702. The external electric cable 700 can provide a connection to a server switch (not shown here). The electrical connector 702 is connected to the chassis 202 and does not move relative to the chassis 202. The electrical connector 702 can, for example, be mounted directly to a motherboard sled (e.g., the motherboard sled 312 shown in FIG. 3). The connector 702 is proximate to the front window 204. Access to connector 702 or a similar second connector 704 can be difficult because the protruding PCIe module 206 confines the space around the connector 704. However, the PCIe module 206 can be moved to aid in accessing the connectors 702 and 704. For example, an operator can push the bottom of the PCIe module 206 in with a hand 706, and attach a second external cable 708 to connector 704. This applies the undocking force explained above and compresses the spring 604 in FIG. 6A. When the hand 706 stops pushing the PCIe module 206 inward, the spring 604 uncompresses and forces the PCIe module 206 back to the docked position.

FIG. 8A is a schematic side view of a server system 800 that includes a plurality of servers 200 and a server switch 802. The severs 200 and server switch 802 are arranged in a stack in a server rack 804. The front windows 204 of the servers 200 are aligned and coplanar. PCIe modules 206 protrude out of the coplanar front windows 204 in a docked position. The servers also include electrical connectors 806 connected to the server chassis 202. A plurality of the external electrical cables 808 are connected to the electrical connectors 806, one cable for each of the servers 200. Each of the cables 808 is connected to the server switch 802. In some implementations, each server includes more than one electrical connector that can be connected via a cable 808 to the server switch 802.

FIG. 8B shows the server system 800 being serviced. The PCIe modules 206 can be moved from the protruding docked position shown in FIG. 8A to the undocked position as shown by the middle PCIe module 206. The undocked position aids access to the electrical connectors 806 proximate to the front windows 204.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention (disclosed embodiments) has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A server comprising:
   a server chassis having a front window for providing access to an interior receptacle of the server chassis, the server chassis having a docking station within the interior receptacle; and
   a PCIe module coupled to the docking station by a coupling element, the PCIe module having vent holes on a front plate and a top plate, the PCIe module protruding externally from the interior receptacle through the front window in a docked position, the PCIe module movable to a plurality of undocked positions while remaining coupled to the docking station;
   wherein the PCIE module protrudes less externally from the front window in any of the plurality of undocked positions than the PCIe module protrudes in the docked position; and
   wherein a cooling air is flowing through more of the vent holes, into the interior receptacle, when the PCIe module is in the docked position than when the PCIe module is in any of the plurality of undocked positions.

2. The server of claim 1, wherein the coupling element includes an elastic element configured to restore the PCIe module to the docked position from any one of the plurality of undocked positions.

3. The sever of claim 2, wherein the elastic element is a spring.

4. The server of claim 1, wherein the cooling air is flowing through the server chassis, the cooling air having a higher flow rate into the interior receptacle when the PCIe module is in the docked position than when the PCIe module is in any of the plurality of undocked positions.

5. The server of claim 4, wherein the cooling air flow is between 1% and 50% higher when the PCIe module is in the docked position.

6. The server of claim 1, wherein the PCIe module includes a riser board and a riser bracket, the riser board and the riser bracket configured to hold one or more PCIe cards.

7. The server chassis of claim 6, wherein the riser board includes a front portion having at least some of the vent holes, wherein the front portion and at least some of the vent holes are positioned outside of the interior receptacle when the module is in the docking position, and wherein at least a portion of the front portion and a portion of the vent holes are positioned in the interior receptacle when the module is in any of the plurality of undocked positions.

8. The server of claim 6, wherein the coupling element comprises:
   a pin;
   a support member mounted on a side wall of the riser bracket, the support member including a slot;
   wherein a first end of the pin is mounted on a surface of the docking station, and a second end of the pin is inserted into the slot; and
   a spring positioned in the slot and configured to provide a restoring force against the pin and the support member, the restoring force providing an opposing force to an undocking force moving the PCIe module from the docked position to any of the plurality of undocked positions.

9. The server of claim 8, wherein the restoring force moves the PCIe module from the undocked position to any of the plurality of undocked positions.

10. The server of claim 1, further comprising a motherboard sled positioned in the interior receptacle, a front portion of the motherboard sled comprising a part of the docking station to which the PCIe module is coupled.

11. The server of claim 10, further comprising a movable internal cable in the interior receptacle and connecting the PCIe module to the motherboard, the movable internal cable having at least a range of movements commensurate with the docked and the plurality of undocked positions.

12. The server of claim 10, further comprising:
   an external electrical cable connected to an electrical connector positioned in the front portion of the motherboard, the connector proximate to the front window, and
   the external electrical cable configured to connect to a server switch, the PCIe module movable relative to the electrical cable.

* * * * *